(12) United States Patent
Gidon

(10) Patent No.: US 7,352,043 B2
(45) Date of Patent: Apr. 1, 2008

(54) MULTISPECTRAL DETECTOR MATRIX

(75) Inventor: Pierre Gidon, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 112 days.

(21) Appl. No.: 10/540,334

(22) PCT Filed: Dec. 17, 2003

(86) PCT No.: PCT/FR03/50186

§ 371 (c)(1),
(2), (4) Date: Jun. 20, 2005

(87) PCT Pub. No.: WO2004/057675

PCT Pub. Date: Jul. 8, 2004

(65) Prior Publication Data

US 2006/0038251 A1 Feb. 23, 2006

(30) Foreign Application Priority Data

Dec. 19, 2002 (FR) .................................. 02 16178

(51) Int. Cl.
*H01L 31/09* (2006.01)
(52) U.S. Cl. .............. 257/440; 257/444; 257/443; 257/448; 257/E31.093
(58) Field of Classification Search ............. 257/443, 257/444, 440, 448, E31.093
See application file for complete search history.

(56) References Cited

U.S. PATENT DOCUMENTS

| | | |
|---|---|---|
| 4,206,470 A | 6/1980 | White |
| 4,514,755 A | 4/1985 | Tabei |
| 5,373,182 A | 12/1994 | Norton |
| 5,552,603 A | 9/1996 | Stokes |
| 6,157,020 A * | 12/2000 | Krapf et al. .......... 250/214 LA |
| 6,373,117 B1 * | 4/2002 | Theil .......................... 257/444 |
| 6,437,414 B1 * | 8/2002 | Nishino et al. ............. 257/440 |
| 6,465,860 B2 * | 10/2002 | Shigenaka et al. .......... 257/442 |

FOREIGN PATENT DOCUMENTS

WO 99/39372 8/1999

OTHER PUBLICATIONS

International Search Report, for International Application No. PCT/FR03/50186, date mailed Jun. 4, 2004.

* cited by examiner

*Primary Examiner*—Evan Pert
*Assistant Examiner*—Victor A. Mandala, Jr.
(74) *Attorney, Agent, or Firm*—Thelen Reid Brown Raysman & Steiner LLP

(57) ABSTRACT

The invention concerns a matrix structure of multispectral detectors (200) comprising:
 a superimposition of several layers of semiconductor material separated by layers of dielectric material transparent to a light to be detected, said superimposition offering a face for receiving the light to be detected, said superimposition of layers of semiconductor material being spread out in picture elements or pixels, each part of the layer of semiconductor material corresponding to a pixel comprising a light detection element delivering electrical charges in response to the light received by said detection element,
 means for collecting the electrical charges delivered by each light detection element, said collection means being electrically connected to electrical connection means (153) and comprising conductive walls (151).

13 Claims, 10 Drawing Sheets

MULTISPECTRAL DETECTOR MATRIX

CROSS-REFERENCE TO RELATED APPLICATION

This application claims priority based on International Patent Application No. PCT/FR2003/050186, entitled "Multispectral Detector Matrix" by Pierre Gidon, which claims priority of French Application No. 02/16178, filed on Dec. 19, 2002, and which was not published in English.

TECHNICAL FIELD

The subject of the present invention is a matrix of multispectral detectors. The aim of this type of matrix is usually to retranscribe images. It may also be used to exploit light signals from measurement devices.

The term "light" may be understood in its wider sense, in other words from the infrared to the ultraviolet. The detectors deliver electrical signals in relation to the light intensities received. Each spectral range is transformed into different electrical signals. Depending on the structure of the detectors, this colour information comes out in parallel or successively. Certain matrices deliver, moreover, several signals in parallel in order to transmit the information more quickly.

Multiple structures exist for these matrices of photodetectors. Certain structures have a grid that makes it possible to store the charges for an instant before sending them to the amplifiers of the reading circuit. The electrical connection between the matrix of detectors and the reading circuit may be achieved by hybridisation of the matrix on the reading circuit.

STATE OF THE PRIOR ART

Multiple matrix structures for multispectral detectors are known. To obtain the detection of several spectral bands, several solutions are conventionally used.

The most widely known of these solutions consists in using colour filters. Typically, three filters are used: a red filter, a green filter and a blue filter to try to capture the colour information of the visible light. Each image element (or pixel) has only one filter in front of it. The filters change periodically from pixel to pixel but this has the consequence that the resolution for each colour is three times lower than the resolution of the matrix without its three filters. Moreover, around two thirds of the light intensity is lost by absorption in the filters.

Another conventional solution is to use three matrices around an optical prism separating the spectral ranges. This solution overcomes the limitations of the previous solution, but the advantages of compactness of a matrix of detectors are lost. Indeed, the optical prism responsible for separating the wavelengths has a considerable thickness. The bigger the matrices of photodetectors, the thicker and heavier said prism.

Other solutions, less used, call on other optical components such as networks, but at least one of the disadvantages mentioned in the previous solutions are also found in them. In all cases, they involve optical devices added above one or several matrices of detectors.

A recent solution, disclosed in document WO-A-00/62 350, consists in creating a matrix containing a stacking of zones doped and of alternate polarities, thus forming diodes connected in series. Due to their location at different depths, each diode of a stacking detects a different colour. Said highly doped zones have the disadvantage of rapidly recombining the photo-generated electron-hole pairs.

DESCRIPTION OF THE INVENTION

In order to overcome the disadvantages of the prior art, it is proposed here to complexity the structure of the matrices. The solution corresponds principally to the introduction of dielectric layers in the internal structure of the matrix. This complexification takes advantage of the optical absorption properties of the materials. The different wavelengths of a light are absorbed from the surface of the material, but the coefficient of absorption is variable with the wavelength. Certain wavelengths are almost completely absorbed in a very small thickness whereas others continue to propagate in the depth of the material.

The absorption accompanies the creation of electrical charges. Present techniques make it possible to place dielectric layers in the material. One may thus separate the electrical charges created at different depths from each other. If the dielectric layers are transparent, each depth of the absorbent structure then corresponds to different proportions of each of the wavelengths.

The absorption coefficients of the materials are known and constant. If the absorbent structure comprises as many pairs of dielectric/absorbent layers as ranges of wavelengths, the intensities of which need to be measured, and if the thickness of the absorbent layers is chosen in an appropriate manner, then it is possible to obtain sufficient information to go back by calculation to the intensities of each spectral range.

The calculation may be carried out electrically by several conventional methods. It may be carried out by complexifying the analog amplification circuit and by creating suitable counter-reactions between the different operational amplifiers. It may also be done by associating the matrix of detectors and its amplifier circuit with a (or several) analog/digital converters and with a (or several) conventional calculation processor(s).

The subject of the invention is therefore a matrix structure of multispectral detectors comprising:
  a superimposition of several layers of semiconductor material separated by layers of dielectric material transparent to a light to be detected, said superimposition offering a face for receiving the light to be detected, said superimposition of layers of semiconductor material being spread out in picture elements or pixels, each part of the layer of semiconductor material corresponding to a pixel comprising a light detection element delivering electrical charges in response to the light received by said detection element,
  means for collecting the electrical charges delivered by each light detection element, said collection means being electrically connected to electrical connection means and comprising conductive walls filling trenches formed in the superimposition of layers of semiconductor material to assure an electrical contact with all of the layers of semiconductor material and to form an electrode common to all of the detection elements.

The structure may have the form of a wafer having two principal opposite faces: a first face that is the face for receiving the light to be detected and a second electrically insulated face and supporting electrical connection means. Said second face may then constitute a hybridisation face with a device for exploiting the electrical charges collected.

The collection means may comprise conductive feedthroughs. Said conductive feedthroughs may be lodged in sinks, each sink having a depth that makes it possible to reach a corresponding detection element in crossing, without electrical contact, at least one of said layers of dielectric semiconductor material.

Each detection element may comprise at least one semiconductor junction resulting, for example, from the presence of a doped zone in said part of the layer of semiconductor material.

The trenches may be formed along a network of arrays such that an array contains several detection elements. They may also be formed along a network of arrays such that an array contains a single detection element. The conductive walls may be in electrical contact with the layers of semiconductor material by doped zones of said layers of semiconductor material. They may also be locally electrically insulated from the detection elements and from the common electrode to constitute electrical charge storage capacitors. Light reflecting means may be arranged above the conductive walls in order to be able to reflect the light to be detected, directed towards the conductive walls, towards the elements adjacent to the conductive walls.

The superimposition of layers of semiconductor material may comprise layers of semiconductor material of the same or different nature.

According to a specific embodiment, the superimposition comprises n layers of semiconductor material, the thickness of each layer is determined as a function of n wavelength ranges defined from the light spectrum so that the layer of semiconductor material located the nearest to the face for receiving the light absorbs virtually all of a first defined wavelength range, the two layers of semiconductor material located nearest the face for receiving light absorb virtually all of a second defined wavelength range, and so on until n, the intensities measured by each detection element of a same pixel making it possible to restore, as a function of the absorption coefficients of each layer of semiconductor material, the intensities of each of the n wavelengths received by the pixel. Three layers of semiconductor material make it possible to obtain a structure well suited to the detection of light for imaging in the visible range, but for other applications, the number of layers may be higher.

BRIEF DESCRIPTION OF DRAWINGS

The invention will be more fully understood and other advantages and particularities will become clearer on reading the following description, given by way of example and in nowise limitative, along with the appended drawings among which.

DETAILED DESCRIPTION OF EMBODIMENTS OF THE INVENTION

Figure 1:
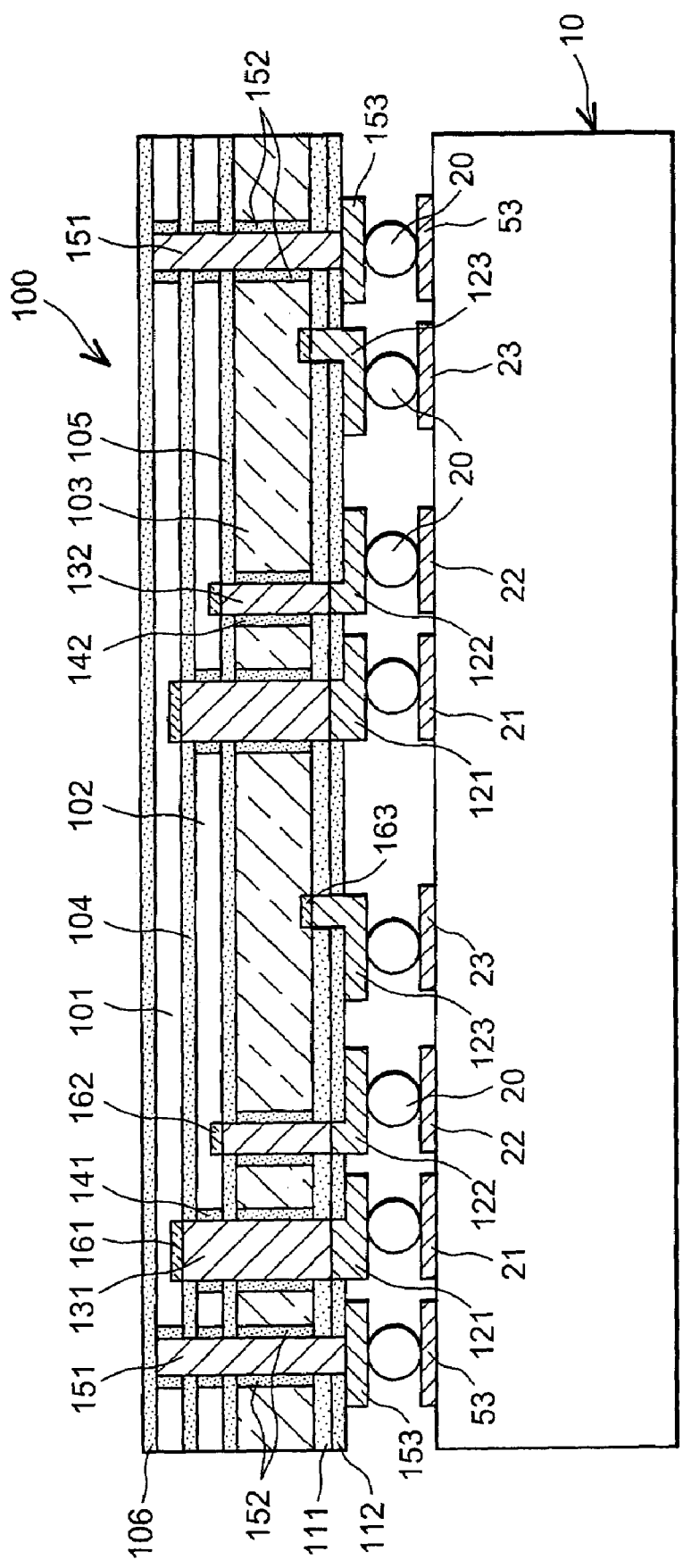
FIG. 1 is a transversal cross-sectional view of a first embodiment of a matrix of multispectral detectors according to the invention, hybridised to a reading circuit.

FIG. 1 is a transversal cross-sectional view of a first embodiment of a matrix of multispectral detectors 100 according to the invention, hybridised to a reading circuit 10.

In this embodiment, the matrix of multispectral detectors 100 comprises, in superimposition, three layers of semiconductor material, for example three layers of silicon 101, 102 and 103 arranged in this order in relation to the source of the light to be detected. A $SiO_2$ layer 104 separates the semiconductor layers 101 and 102. A $SiO_2$ layer 105 separates the semiconductor layers 102 and 103. A $SiO_2$ passivation layer 106 constitutes the face for receiving the light to be detected.

The matrix of detectors 100 is in the form of a wafer. The face of the wafer opposite to the face for receiving the light to be detected, again known as the rear face, is provided with a first dielectric layer 111 and a second dielectric layer 112.

FIG. 1 only shows two pixels, but their number may be several thousands in each direction of the plane. Each pixel comprises three conductor pads 121, 122 and 123 connected respectively to parts of the semiconductor layers 101, 102 and 103 and arranged on the rear face of the structure. Each conductor pad 121 is electrically connected to its part of semiconductor layer 101 by a conductive feedthrough 131 contained in a sink provided with a wall 141 electrically insulating for the semiconductor layers 102 and 103. Each conductor pad 122 is electrically connected to its part of the semiconductor layer 102 by a conductive feedthrough 132 contained in a sink provided with a wall 142 electrically insulating for the semiconductor layer 103. Each conductor pad 123 is electrically and directly connected to its part of semiconductor layer 103.

The pixels represented in FIG. 1 are surrounded by conductive walls 151, for example in polysilicon, contained in the trenches formed in the superimposition of semiconductor layers 101, 102 and 103. Said conductive walls are in electrical contact with the semiconductor layers 101, 102 and 103. The faces 152 of the trenches may be doped in order to complete the electrical contact with the layers of semiconductor material 101, 102 and 103. The conductive walls 151 constitute the electrode common to all the photodiodes of the matrix of detectors. They are electrically connected to conductor pads 153 located on the rear face of the structure.

Each pixel of the structure represented comprises three parts of layers of semiconductor material 101, 102 and 103 and thus three junction diodes. The diodes are formed by doping, by a suitable dopant, the zones of semiconductor material. Thus, the pads 123 are connected to the doped zones 163 of the semiconductor layer 103. The pads 122 are connected, through the intermediary of feedthroughs 132, to doped zones 162 of the semiconductor layer 102. The pads 121 are connected, through the intermediary of feedthroughs 131, to doped zones 161 of the semiconductor layer 101.

The layers of dielectric material 104 and 105 have a thickness far below the wavelengths of light to be detected in order to minimise optical reflections. They have a sufficient thickness to withstand the voltages brought into play to evacuate the charges, in other words around 20 µm.

The reading circuit 10 supports, on a face placed opposite the rear face of the matrix of detectors 100, contact pads 21, 22, 23 and 53 that constitute inputs for the reading circuit. The pads 21, 22, 23 and 53 are arranged opposite respectively the pads 121, 122, 123 and 153. The corresponding pads are connected to each other by conductive beads 20.

Figure 2:
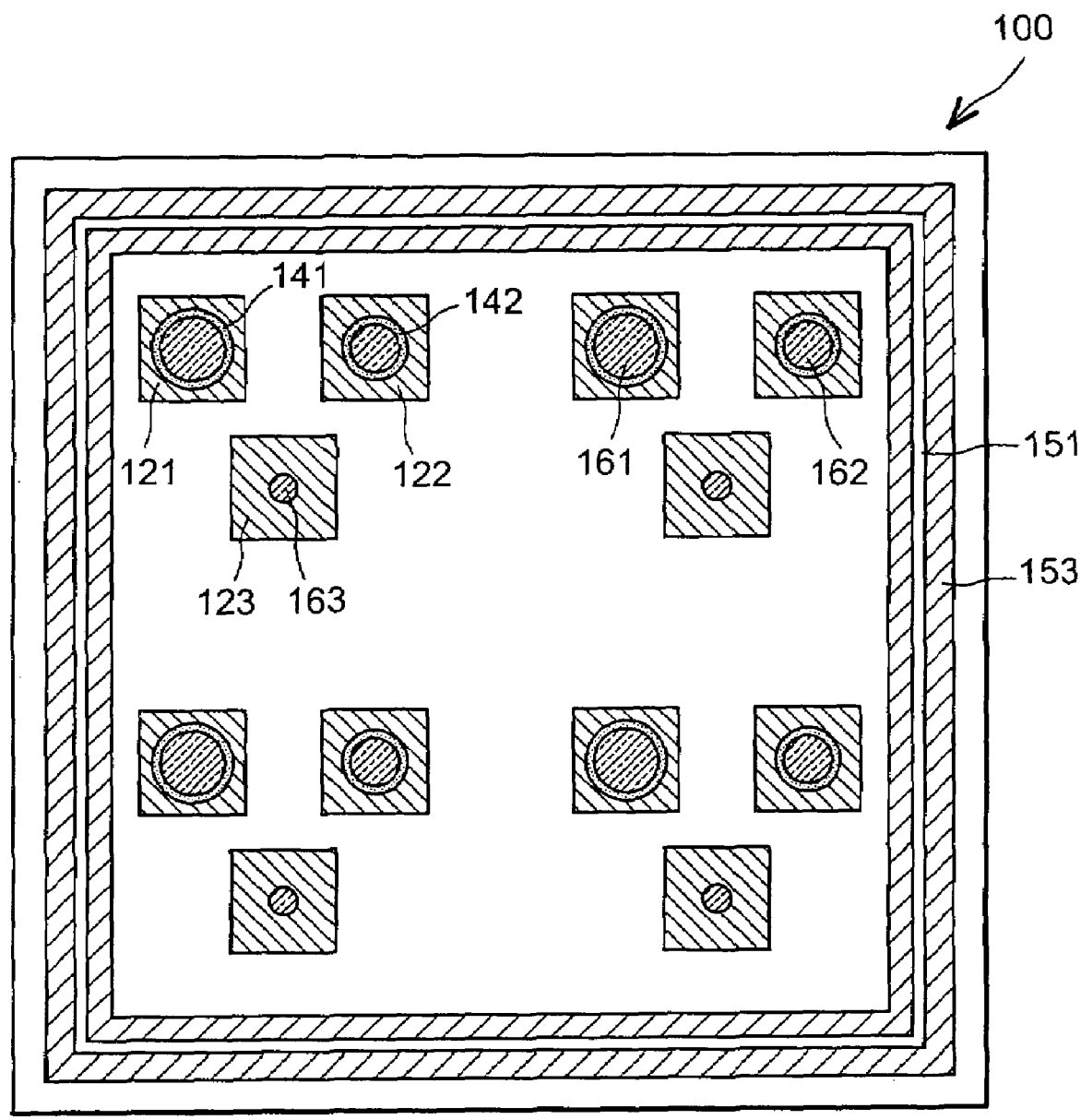
FIG. 2 is an overhead view of a matrix of multispectral detectors of the type of the first embodiment according to the invention.

FIG. 2 is an overhead view of a matrix of multispectral detectors of the type of the first embodiment of the invention. It is intended to shown in a favoured manner certain elements of the structure. The elements shown bear the same references as in FIG. 1, even if their arrangement is not the same. In particular, the photodiodes of a same pixel are arranged in a triangle and the conductive walls 151 form a square containing four pixels.

In the structures illustrated in FIGS. 1 and 2, there is no physical limit between the pixels contained in the array defined by the conductive walls 151. The collection of photoelectrons is achieved most probably by the nearest junction in each layer of semiconductor material. On the other hand, each layer of semiconductor material is insulated from the others and only receives the photons that reach it.

Figure 3:
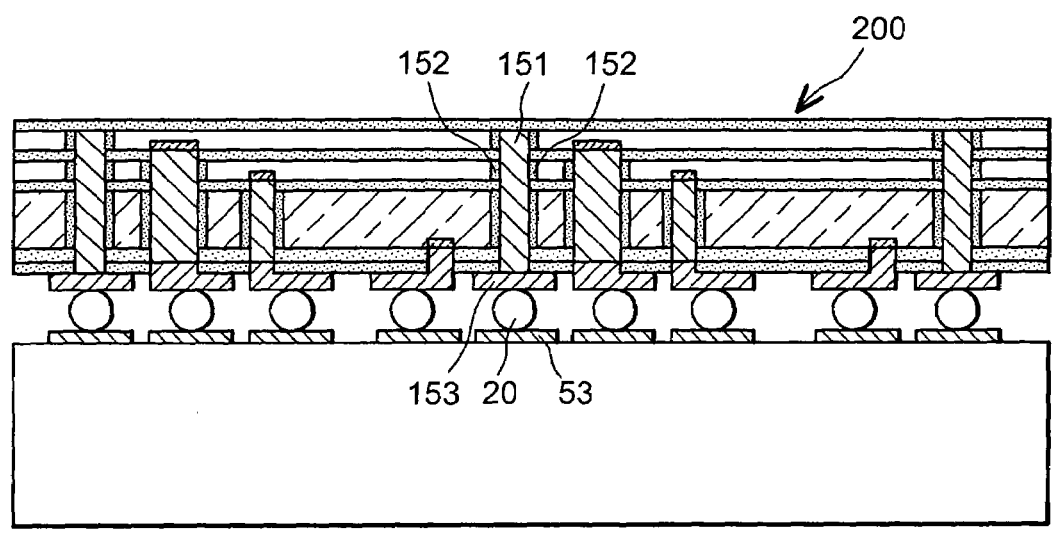
FIG. 3 is a transversal cross-sectional view of a second embodiment of a matrix of multispectral detectors according to the invention, hybridised to a reading circuit.

FIG. 3 is transversal cross-sectional view of a second embodiment of a matrix of multispectral detectors 200 according to the invention, hybridised to a reading circuit 10.

The only difference between this matrix of detectors and that of FIG. 1 is that all of the pixels are physically insulated from each other. The two pixels visible in this figure are separated by a conductive wall 151 analogous to the conductive walls 151 of FIG. 1. The conductive wall 151 is contained in a trench formed in the superimposition of semiconductor layers. The faces 152 of the trenches may be doped. As for the matrix of FIG. 1, the conductive wall 151 is electrically connected to a conductor pad 153 located on the rear face of the structure.

The reading circuit 10 may comprise an additional contact pad 53 in order to obtain an additional electrical connection, through the intermediary of the conductive bead 20, with the conductor pad 153. Although it is not necessary in all cases, the additional contact pad is advantageous in the event where the electrode is complex. It may indeed be interesting to transfer the interconnections on the reading circuit 10.

Figure 4:
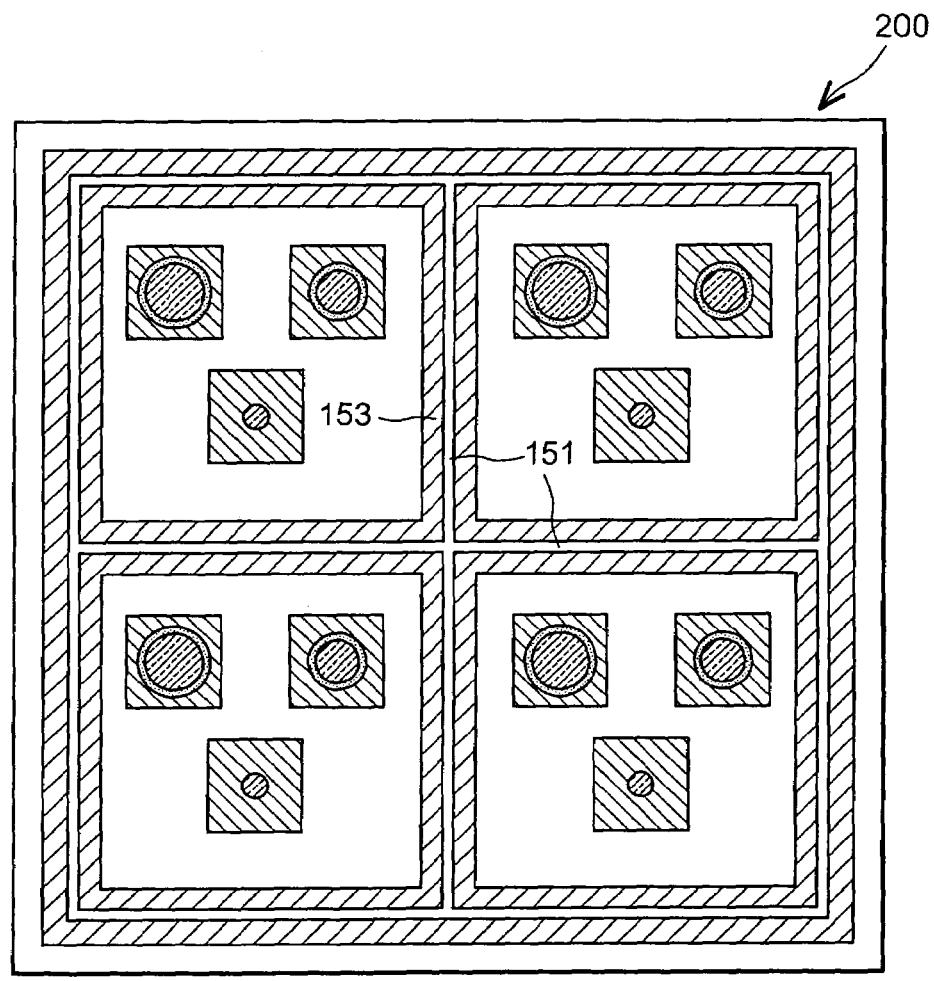
FIG. 4 is an overhead view of a matrix of multispectral detectors of the type of the second embodiment according to the invention.

FIG. 4 is an overhead view of a matrix of multispectral detectors of the type of the second embodiment according to the invention. It is intended to show in a favoured manner certain elements of the structure. The elements shown are not arranged in the same way as in FIG. 3. In particular, the photodiodes of a same pixel are arranged in a triangle.

The second embodiment is preferred in the presence of dazzling sources. The quality of the images that it makes it possible to obtain is better than that provided by the first embodiment of the invention. If there is no physical separation between pixels, the photoelectrons generated for example by the red in the different semiconductor layers may diffuse outside of their zone. The same is true for the photoelectrons stemming from the green. At the limit of the two red and green zones site by side then appears a misleading yellow zone (mixture of red and green according to the trichromatic principle). Moreover, since the diffusion of photoelectrons stemming from the red or green are different, since they are generated in different layers, the yellow zone is not centred on the limit of the green and red zones but is shifted. A structure of pixels physically completely separated does not have these problems of lateral diffusion.

A disadvantage of the multiplication of conductive walls is that a non-negligible part of the lit surface is no longer detecting. A solution for overcoming this disadvantage is placing pyramids (or knife edges) with a reflecting surface on the conductive walls to reflect the incident light towards the detecting surface.

Figure 5:
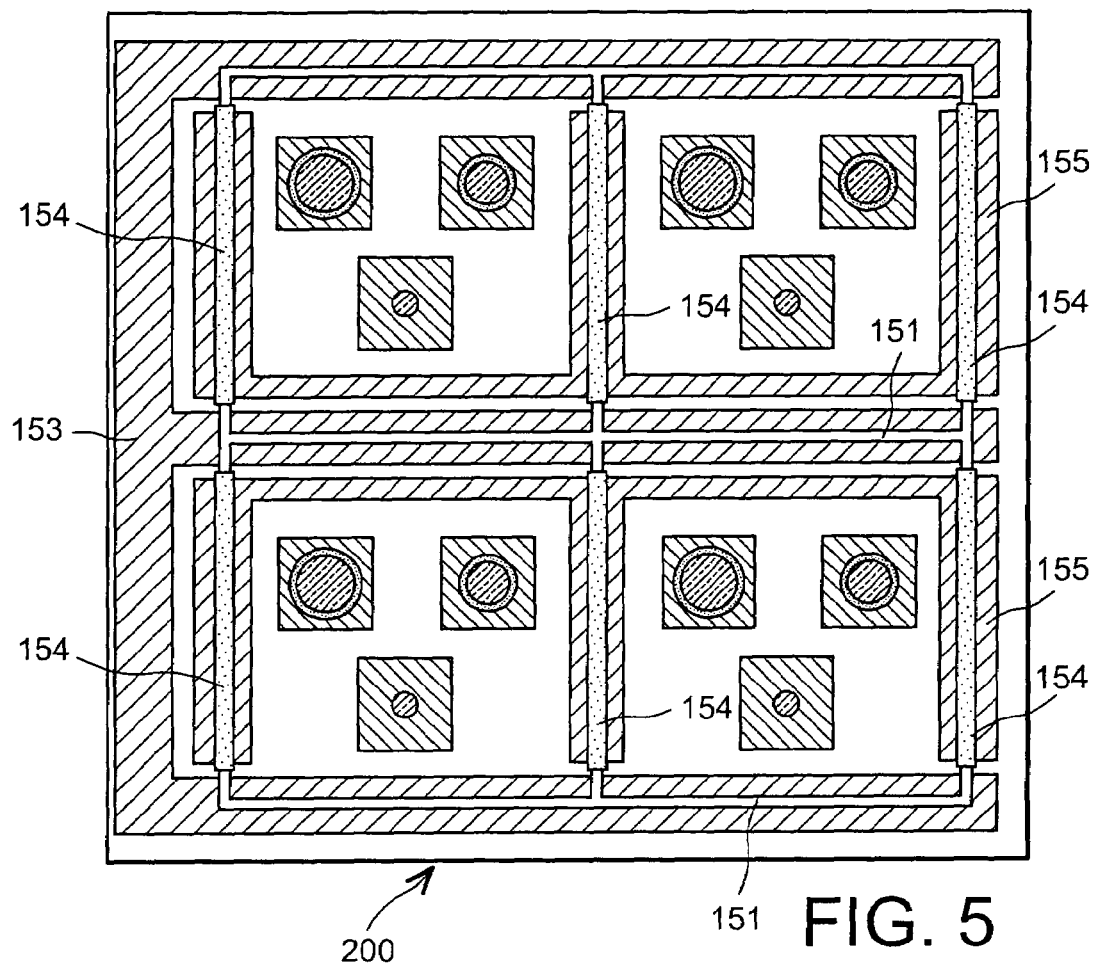
FIG. 5 is an overhead view of a third embodiment of a matrix of multispectral detectors according to the invention.

FIG. 5 is an overhead view of a third embodiment of a matrix of multispectral detectors according to the invention.

The matrix of detectors illustrated by this figure is a structure of insulated pixels as in the previous figure, but made more complex compared to the previous structure in order to add to it a charge storage capacity, the potential of which is controllable.

The conductive walls 151 completely insulate each pixel, as for the embodiment represented in FIG. 4. Unlike the previous embodiment, parts of said walls are electrically insulated from the layers of semiconductor material and the other conductive parts. Said parts are designated under the reference 154. This results in another configuration of the electrode 153 common to the photodiodes and the presence of conductive tracks 155 forming a second electrode for the capacitors thus created. The electrode 153 and the parts 154 are connected to the different electrodes in order to charge and discharge the storage capacitors thus formed.

All of the layers of semiconductor material of the structure are concerned by this new embodiment. Each pixel of each layer then has a capacitance forming the photogrid. In practice, it is advantageous to place one edge of the doped zones as close as possible to the capacitance. The reason is that the transfer of charges at the moment of the change of capacitance potential, which makes it possible to facilitate the discharging of the accumulated photo-charges towards the amplifiers in the reading circuit.

Obviously, other embodiments are possible. For example, the detecting layers may be in semiconductor material of different nature.

Figure 6:
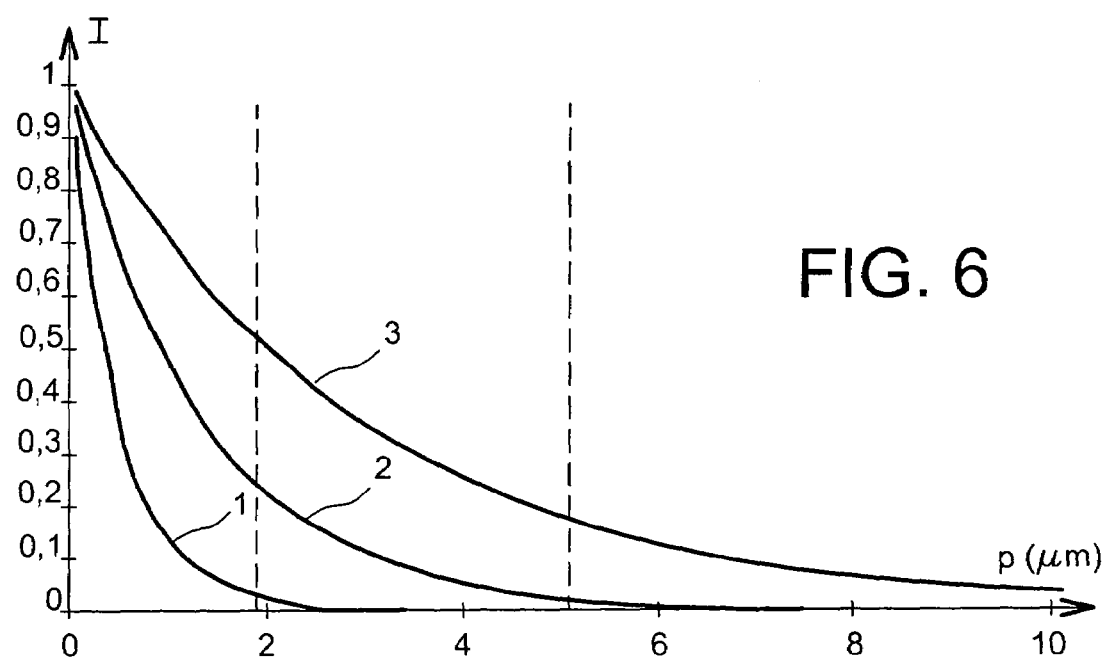
FIG. 6 is a graph representing light absorption curves in a semiconductor material for three different wavelengths.

In the general case of the invention, there is no specific constraint for determining the thickness of the layers. FIG. 6 is a graph representing light absorption curves in a semiconductor material for three different wavelengths. The Y axis represents the remaining intensity I as a function of the depth p of penetration in a semiconductor material. The graph thus represents the absorption of light in a semiconductor material, in this particular case silicon. The absorption has been traced for three wavelengths. Curve 1 represents the absorption of a wavelength of 0.45 µm (blue light) and corresponds to an absorption coefficient α equal to 2. Curve 2 represents the absorption of a wavelength of 0.53 µm (green light) and corresponds to an absorption coefficient α equal to 0.75. Curve 3 represents the absorption of a wavelength of 0.65 µm (red light) and corresponds to an absorption coefficient α equal to 0.35.

This graph shows that at 2 µm depth, more than 90% of the blue light has been absorbed and that after 5 µm of depth, more than 90% of the green light has been as well. This seems near to a good compromise for the sensitivity to the visible colours. The ideal compromise should maximise the quantity of photons and obtain a very different proportion of photons in each of the layers of semiconductor material.

The intensity of a light wave propagating in an absorbent material is given by the expression:

$$I = I_o \cdot E^{-\alpha x}$$

Where Io is the intensity of the wave before its penetration in an absorbent material and x the distance (or depth) covered by the wave in the material.

If one sets the minimum absorption of all of the spectral ranges (for example at 90%), then the thickness of the semiconductor layers is set since the absorption coefficients are constant.

By way of example, for semiconductor layers in silicon, the layer 101 may have 2 µm thickness, the layer 102 3 µm thickness and the layer 103 7 µm thickness.

The intensities measured in each layer ($I_1$, $I_2$, $I_3$) are a combination of the intensities of each red (R), green (G) and blue (B) ranges:

$$I_1 = a_1 \cdot R + b_1 \cdot G + c_1 \cdot B$$

$$I_2 = a_2 \cdot R + b_2 \cdot G + c_2 \cdot B$$

$$I_3 = a_3 \cdot R + b_3 \cdot G + c_3 \cdot B$$

The coefficients ($a_1$, $a_2$, $a_3$, $b_1$, $b_2$, etc.) are constant for a given structure, depending on the thickness of the layers and the nature of the semiconductor material. The values of the intensities measured enable the values of R, G and B to be restored.

Figure 7A:
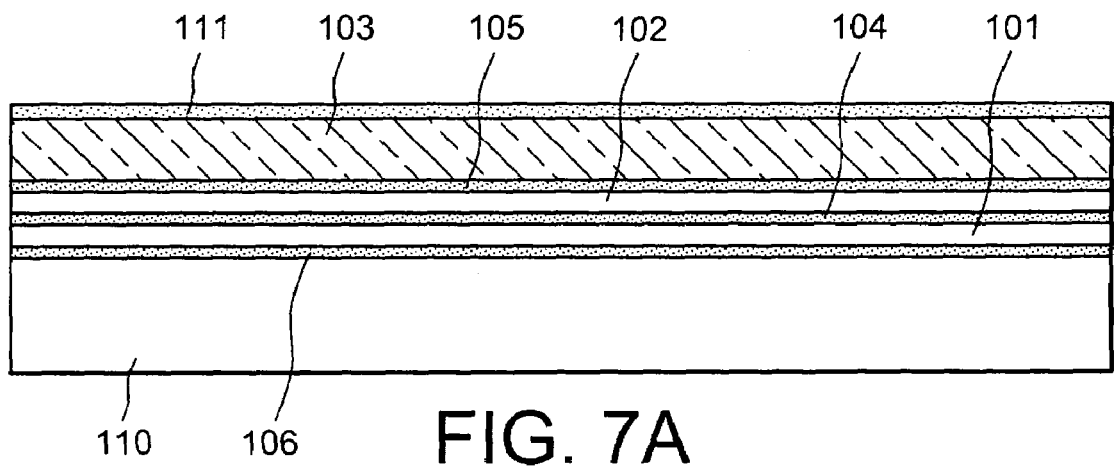
FIGS. 7A to 7R illustrate a method for forming the second embodiment of a matrix of multispectral detectors according to the invention.
Figure 7B:
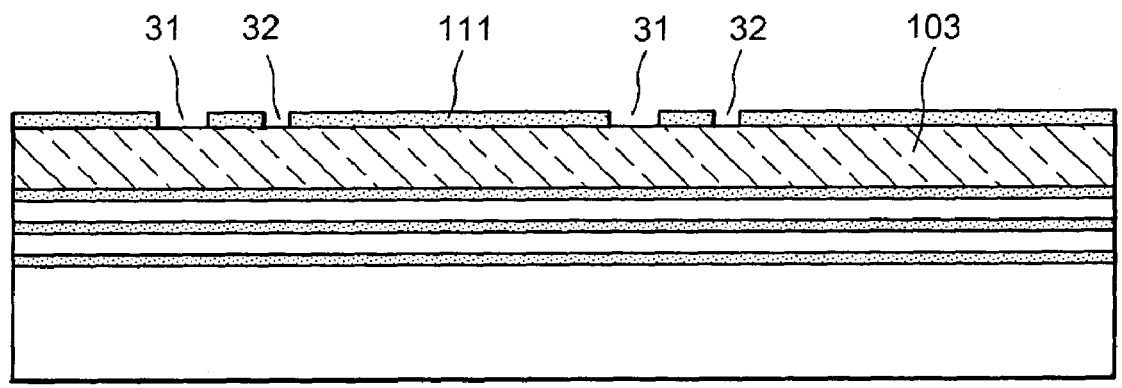
Figure 7C:
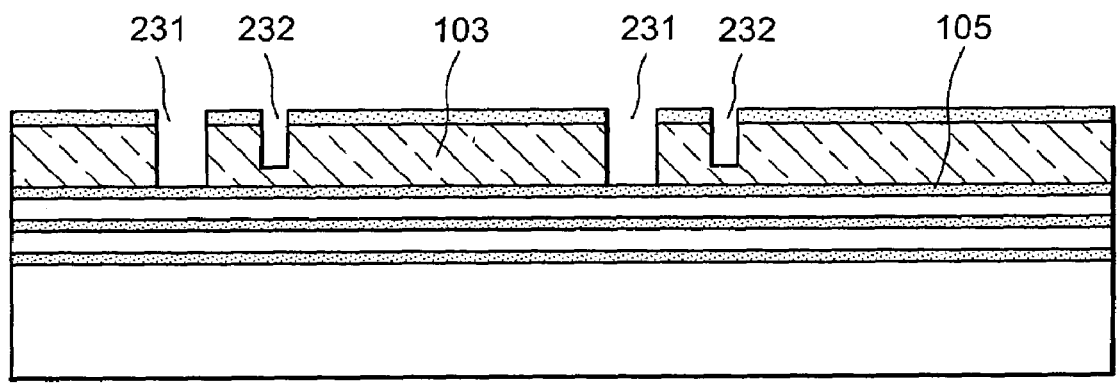
Figure 7D:
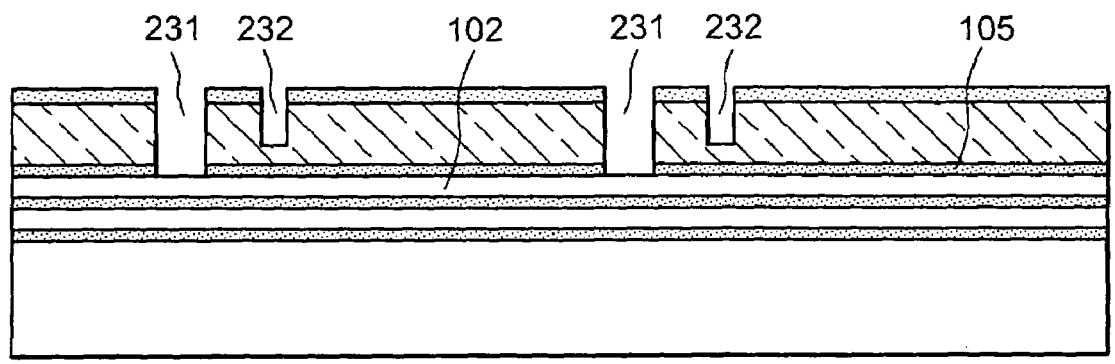
Figure 7E:
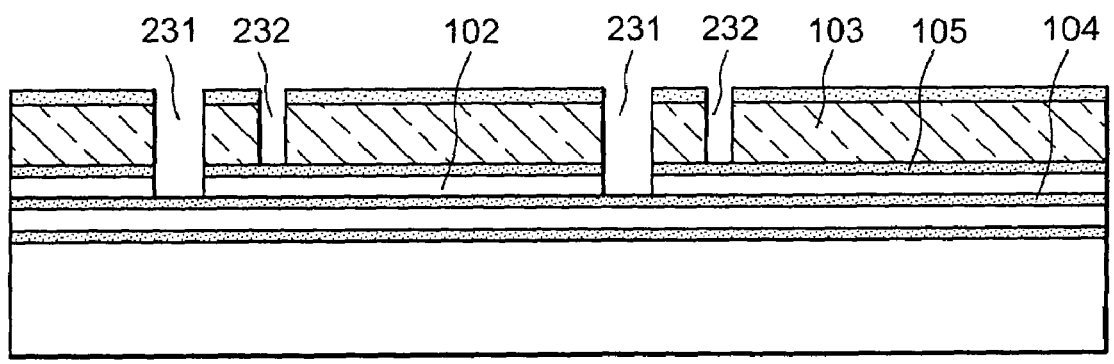
Figure 7F:
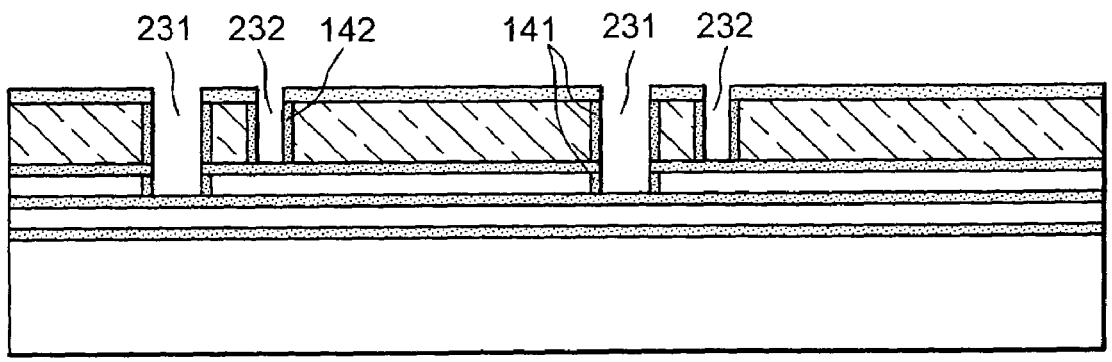
Figure 7G:
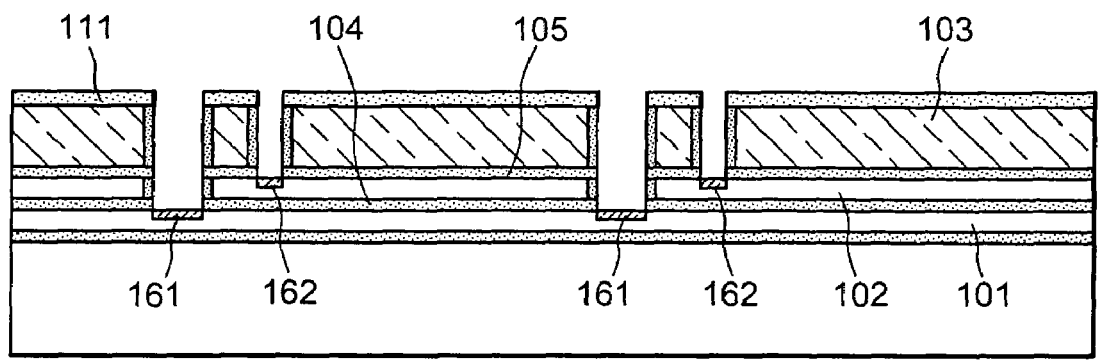
Figure 7H:
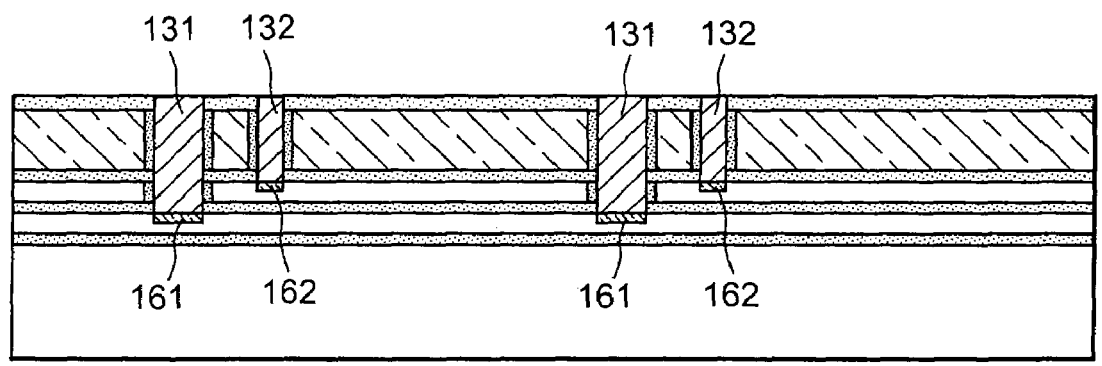
Figure 7I:
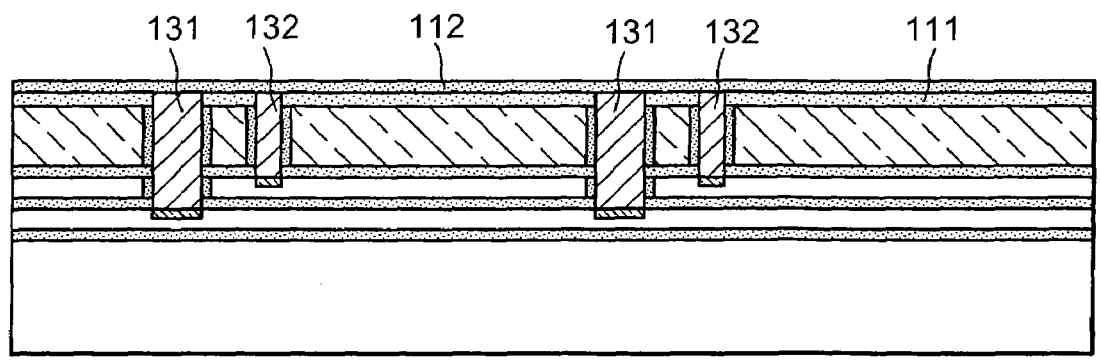
Figure 7J:
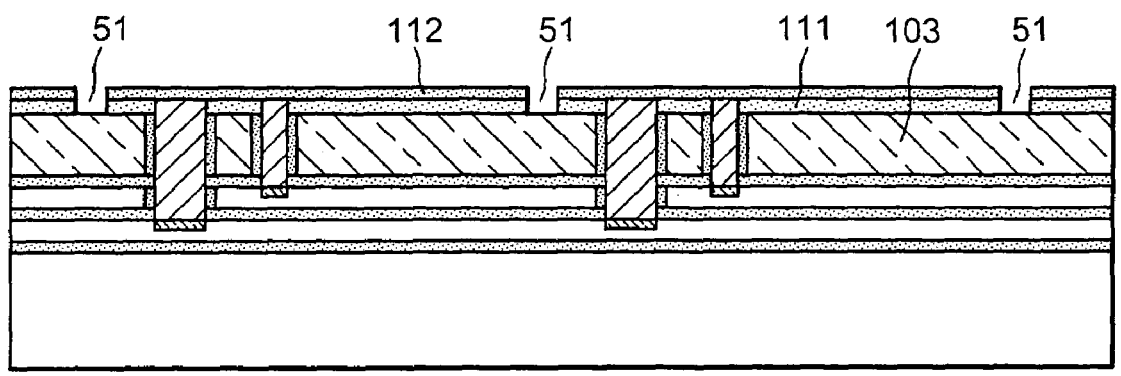
Figure 7K:
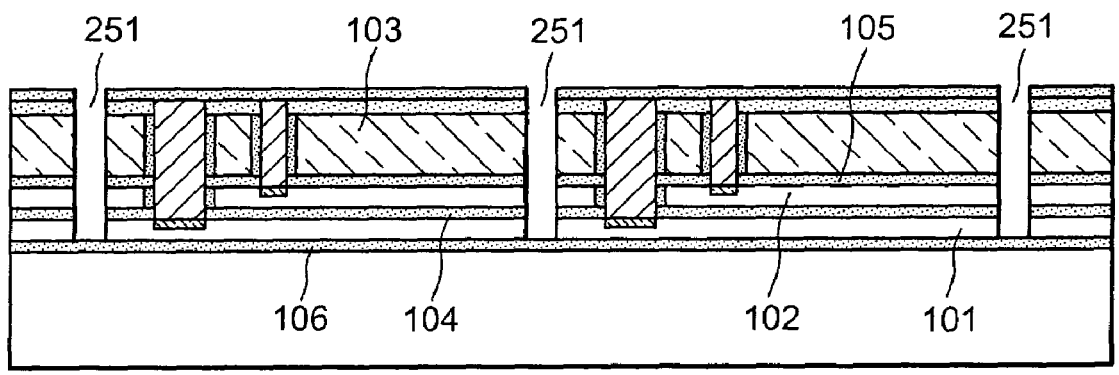
Figure 7L:
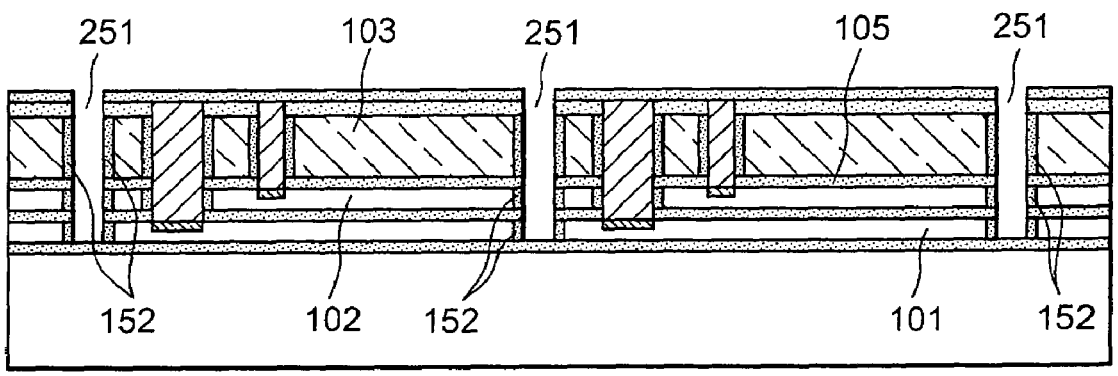
Figure 7M:
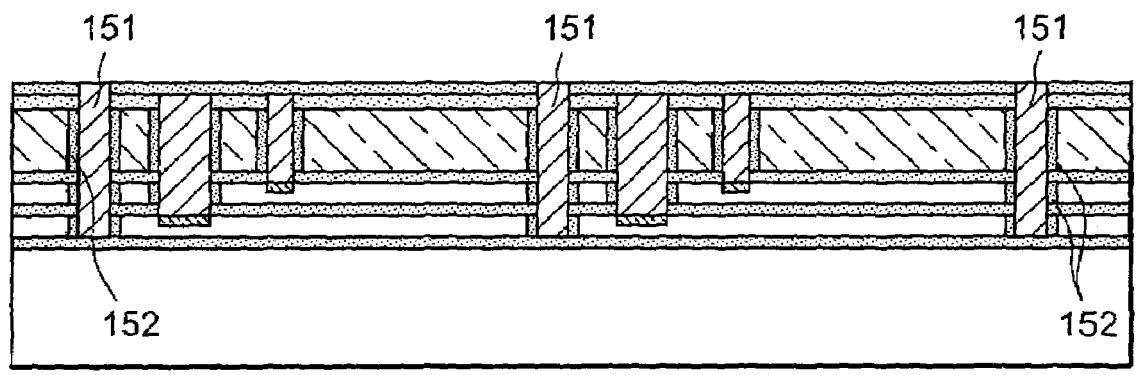
Figure 7N:
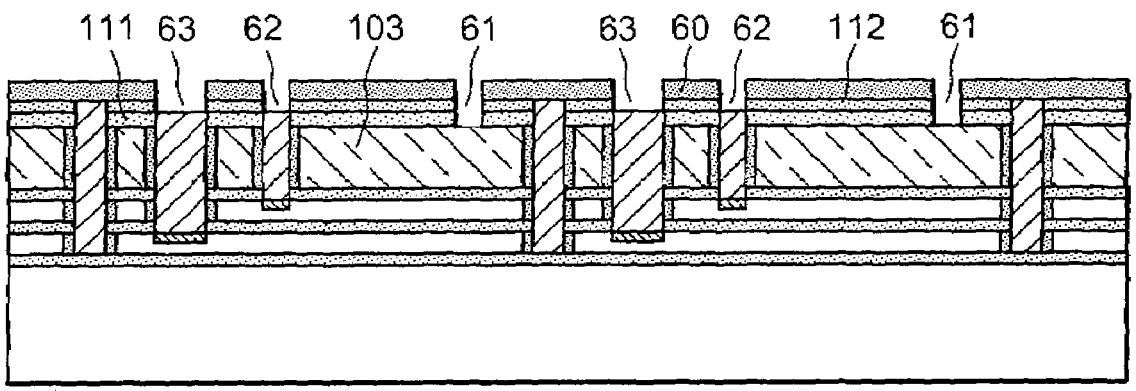
Figure 7O:
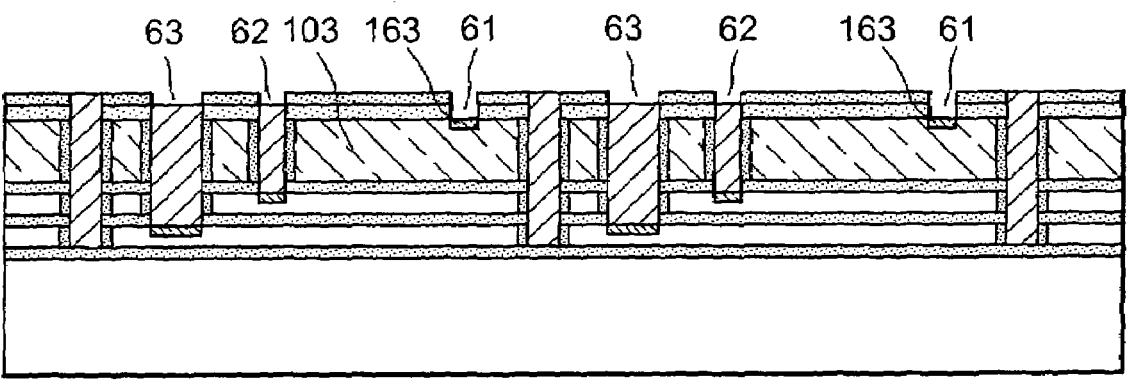
Figure 7P:
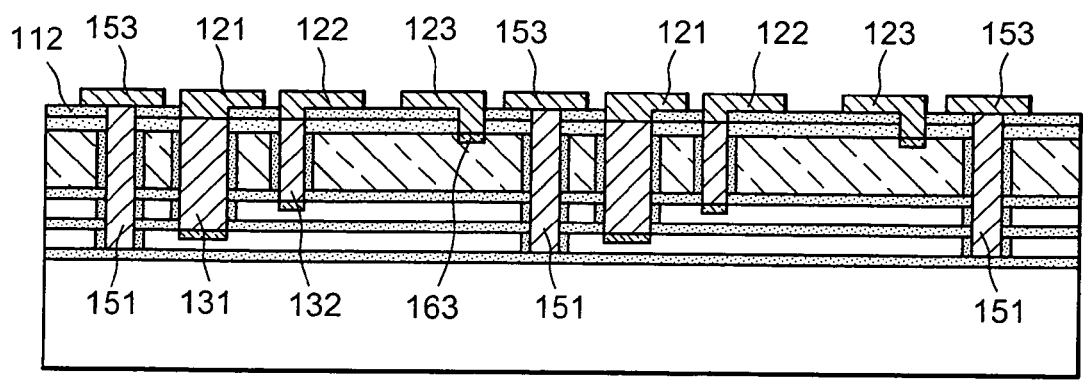
Figure 7Q:
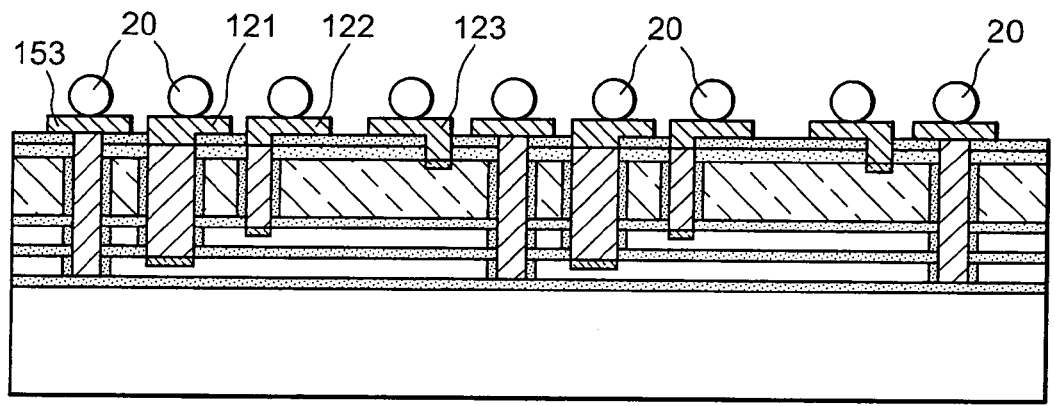
Figure 7R:
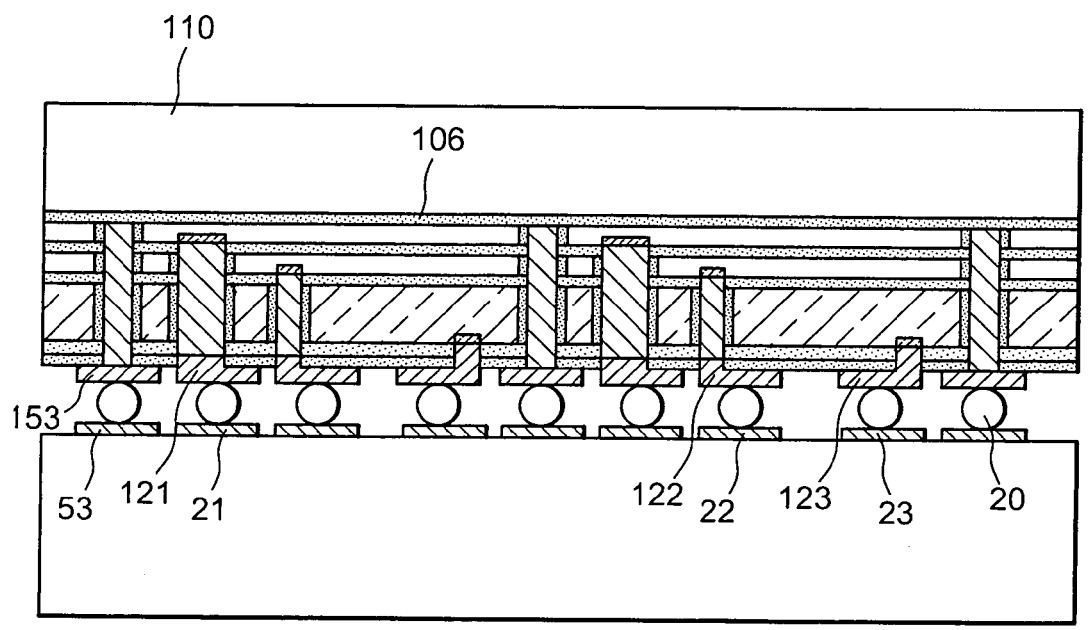

FIGS. 7A to 7R illustrate a method of forming the second embodiment of the matrix of detectors according to the invention.

As shown in FIG. 7A, a superimposition of layers of semiconductor material separated by layers of transparent dielectric material has been formed on a silicon substrate 110. The superimposition has, for example, been formed by a conventional technique for obtaining SOI substrates.

The substrate 110 supports successively a dielectric layer 106, a semiconductor layer 101, a dielectric layer 104, a semiconductor layer 102, a dielectric layer 105, a semiconductor layer 103 and a dielectric layer 111. The layers 101, 102 and 103 are for example in silicon. Their thickness has been determined as indicated above. The layers 106, 104, 105 and 111 are for example in silicon oxide.

FIGS. 7B to 7H illustrate the formation of trenches and diodes in the buried semiconductor layers.

Layer 111 is etched by carrying out a photolithography step then the etching of the passivation oxide layer 111. The remaining resin is eliminated to provide the structure shown in FIG. 7B where the openings 31 and 32 expose the semiconductor layer 103. The openings 31 are bigger than the openings 32.

The semiconductor layer 103 is then etched (see FIG. 7C) until the dielectric layer 105 is reached. The layer 105 is reached when the etched trenches correspond to the biggest openings (openings 31 of FIG. 7B), in other words the trenches 231 are formed. The trenches 232 correspond to the smaller openings, in other words the openings 32.

FIG. 7D represents the structure obtained when the layer of oxide 105 exposed in the trenches 231 is etched to expose the semiconductor layer 102. The semiconductor material is not affected by this etching.

The semiconductor layer 102 is then etched from the trenches 231 until the dielectric layer 104 is exposed at the base of said trenches. The etching of the semiconductor layer 103 also continues from the base of the trenches 232 to reach virtually simultaneously the dielectric layer 105. This simultaneity results from the choice of the opening diameters 31 and 32 (see FIG. 7B). The structure obtained is shown in FIG. 7E.

The walls 141 and 142 respectively of trenches 231 and 232 are then oxidised as shown in FIG. 7F.

Dopants are then implanted. Said dopants reach the zones 161 and 162 of the semiconductor layers respectively 101 and 102. The dopants cross the dielectric layers 104 and 105, which are thin films of oxide, but do not reach the semiconductor layer 103 since the dielectric layer 111 is in thick oxide. A dry anisotropic etching then makes it possible to eliminate the thin oxide covering the doped zones 161 and 162. This is shown in FIG. 7G.

The trenches are then filled by an electrically conductive material such as polysilicon to provide the trenches 131 and 132 assuring an electrical contact with the doped zones respectively 161 and 162. The filling surplus is eliminated by polishing and one obtains the structure shown in FIG. 7H.

FIGS. 7I to 7M illustrate the formation of trenches to obtain the common electrode.

A surface passivation layer 112 is deposited on the layer 111 covering the feedthroughs 131 and 132. This is shown in FIG. 7I.

Openings 51 are formed in the layers 112 and 111 until the semiconductor layer 103 is exposed. This may be achieved by steps of photolithography and etching of the layers 112 and 111 and by elimination of the remaining resin. One obtains the structure shown in FIG. 7J.

Then one successively etches, through openings 51, the semiconductor 103, dielectric 105, semiconductor 102, dielectric 104 and semiconductor 101 layers until the dielectric layer 106 is reached. One obtains trenches 251 as shown in FIG. 7K.

The faces 152 of the trenches 251 are doped by diffusion of dopants in the semiconductor layers 101, 102 and 103. One obtains the structure shown in FIG. 7L.

The trenches are then filled by an electrically conductive material such as polysilicon to provide walls assuring an electrical contact with the doped faces 152. The filling surplus is eliminated by polishing. One obtains the structure shown in FIG. 7M.

FIGS. 7N to 7O illustrate the formation of doped zones in the semiconductor layer 103.

FIG. 7N shows that a layer of resin 60 has been deposited on the layer 112 and that it has been treated by photolithography to form, by etching of the dielectric layers 111 and 112, openings 61, 62 and 63 exposing the semiconductor layer 103 and the upper part of the trenches 131 and 132.

Then dopants are implanted in the semiconductor layer 103, in the zones exposed by the openings 61, 62 and 63. The resin is then eliminated. The dopants are activated. One obtains the structure shown in FIG. 7O. The newly doped zones are referenced 163. The doped zones in the polysilicon do not have specific characteristics.

FIG. 7P represents the structure obtained when the conductor pads have been deposited. To obtain this result, the dielectric layer has been slightly de-oxidised and a metallic layer has been deposited. One carries out a photolithography of the metallic layer. The conductor pads are etched in said metallic layer and the remaining resin is eliminated. One obtains pads 153 in contact with the walls 151, pads 121 in contact with the feedthroughs 131, pads 122 in contact with the trenches 132 and pads 123 in contact with the doped zones 163.

FIG. 7Q shows hybridisation beads 20 that have been formed on the conductor pads 153, 121, 122 and 123.

FIG. 7R shows the hybridisation of the structure obtained on a reading circuit 10 by means of beads 20. Said beads 20 connect electrically and respectively the pads 153, 121, 122 and 123 of the structure to the pads 53, 21, 22 and 23 of the reading circuit 10. The space between the beads is filled, if necessary, by a non-electrically conductive material.

The substrate 10 is then eliminated by thinning up to the layer 106 that serves as a boundary and protective layer. One then obtains the device represented in FIG. 3.

The matrix of detectors according to the invention makes it possible to treat the maximum incident light. All the lit face, advantageously provided with an anti-reflection layer, transmits the light that it receives within the interior of the structure. The separation of the spectral layers does not necessitate any external optical component, or filter, or prism. The matrix keeps its resolution whatever the number of spectral ranges chosen. The number of semiconductor layers determines the number of spectral ranges, but does not modify the thickness or the weight of the matrix of photodetectors.

The invention claimed is:

1. Matrix structure of multispectral detectors comprising:
  a superimposition of several layers of semiconductor material separated by layers of dielectric material transparent to a light to be detected, said layers of said superimposition all having the same material composition, said superimposition offering a face for receiving the light to be detected, said superimposition of layers of semiconductor material being spread out in picture elements or pixels, each part of the layer of semiconductor material corresponding to a pixel comprising a light detection element delivering electrical charges in response to the light received by said detection element,
  means for collecting the electrical charges delivered by each light detection element, said collection means being electrically connected to electrical connection means and comprising conductive walls filling trenches formed in the superimposition of layers of semiconductor material to assure an electrical contact with all of the layers of semiconductor material and to form an electrode common to all of the detection elements.

2. Structure according to claim 1, wherein it has the form of a wafer having two principal opposite faces: a first face that is the face for receiving the light to be detected and a second face electrically insulated and supporting the electrical connection means.

3. Structure according to claim 2, wherein second face constitutes a hybridisation face with a device for exploiting the electrical charges collected.

4. Structure according to claim 1, wherein the collection means comprise conductive feedthroughs.

5. Structure according to claim 4, wherein the conductive feedthroughs are lodged in sinks, each sink having a depth that makes it possible to reach a corresponding detection element in crossing, without electrical contact, at least one of said layers of dielectric semiconductor material.

6. Structure according to claim 1, wherein said detection element comprises at least one semiconductor junction.

7. Structure according to claim 6, wherein said semiconductor junction is constituted by the presence of a doped zone in said part of the layer of semiconductor material.

8. Structure according to claim 1, wherein the trenches are formed along a network of arrays such that an array contains several detection elements.

9. Structure according to claim 1, wherein the trenches are formed along a network of arrays such that an array contains a single detection element.

10. Structure according to claim 1, wherein the conductive walls are in electrical contact with the layers of semiconductor material by doped zones of said layers of semiconductor material.

11. Structure according to claim 1, wherein the conductive walls are locally electrically insulated from the detection elements and the common electrode to constitute electrical charge storage capacitors.

12. Structure according to claim 1, wherein the means of reflecting the light are arranged above the conductive walls in order to reflect the light to be detected, directed towards the conductive walls, towards the elements adjacent to the conductive walls.

13. Structure according to claim 1, wherein the superimposition comprises n layers of semiconductor material, the thickness of each layer is determined as a function of n wavelength ranges defined from the light spectrum, wherein groups of consecutive layers, each group beginning at the layer nearest to the face for receiving the light, are each configured to absorb substantially all light of an associated wavelength, and wherein the intensities measured by each detection element of a same pixel making it possible to determine, as a function of the absorption coefficients of each layer of semiconductor material, the intensities of each of the n wavelengths received by the pixel.

* * * * *